(12) United States Patent
Basu et al.

(10) Patent No.: US 11,362,188 B2
(45) Date of Patent: Jun. 14, 2022

(54) FIELD EFFECT TRANSISTORS WITH REDUCED ELECTRIC FIELD BY THICKENING DIELECTRIC ON THE DRAIN SIDE

(71) Applicant: Intel Corporation, Santa Clara, CA (US)

(72) Inventors: Dipanjan Basu, Hillsboro, OR (US); Sean T. Ma, Portland, OR (US); Willy Rachmady, Beaverton, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/651,294

(22) PCT Filed: Dec. 27, 2017

(86) PCT No.: PCT/US2017/068558
§ 371 (c)(1),
(2) Date: Mar. 26, 2020

(87) PCT Pub. No.: WO2019/132887
PCT Pub. Date: Jul. 4, 2019

(65) Prior Publication Data
US 2020/0279931 A1    Sep. 3, 2020

(51) Int. Cl.
*H01L 29/423*    (2006.01)
*H01L 29/51*     (2006.01)
(Continued)

(52) U.S. Cl.
CPC ...... *H01L 29/42368* (2013.01); *H01L 29/513* (2013.01); *H01L 29/66795* (2013.01); *H01L 29/785* (2013.01)

(58) Field of Classification Search
CPC ............. H01L 29/42368; H01L 29/513; H01L 29/66795; H01L 29/785
See application file for complete search history.

(56) References Cited

U.S. PATENT DOCUMENTS 4,958,321 A * 9/1990 Chang ................ G11C 16/0416
257/E29.306
6,121,666 A * 9/2000 Burr .................... H01L 29/7835
257/344

(Continued)

OTHER PUBLICATIONS

International Search Report and Written Opinion for International Patent Application No. PCT/US17/68558, dated Aug. 28, 2018.

(Continued)

*Primary Examiner* — Douglas W Owens
(74) *Attorney, Agent, or Firm* — Essential Patents Group, LLP

(57) ABSTRACT

An apparatus is provided which comprises: a source and a drain with a channel region therebetween, the channel region comprising a semiconductor material, and a gate dielectric layer over at least a portion of the channel region, wherein the gate dielectric layer comprises a first thickness proximate to the source and a second thickness proximate to the drain, wherein the second thickness is greater than the first thickness, and wherein at least a portion of the gate dielectric layer comprises a linearly varying thickness over the channel region. Other embodiments are also disclosed and claimed.

10 Claims, 8 Drawing Sheets

(51) Int. Cl.
*H01L 29/66* (2006.01)
*H01L 29/78* (2006.01)

(56) References Cited

U.S. PATENT DOCUMENTS

| | | | | |
|---|---|---|---|---|
| 6,136,674 A | * | 10/2000 | An | H01L 21/26506 438/585 |
| 6,229,184 B1 | * | 5/2001 | Riccobene | H01L 21/28202 257/368 |
| 6,743,688 B1 | * | 6/2004 | Gardner | H01L 21/265 257/E21.334 |
| 2006/0237774 A1 | | 10/2006 | Bryant et al. | |
| 2006/0237781 A1 | * | 10/2006 | Marchant | H01L 29/42368 257/330 |
| 2007/0290250 A1 | | 12/2007 | Clark et al. | |
| 2008/0191257 A1 | * | 8/2008 | Temmler | H01L 27/10826 257/300 |
| 2009/0032872 A1 | | 2/2009 | Giles et al. | |
| 2010/0295126 A1 | * | 11/2010 | Ito | H01L 29/517 257/343 |
| 2011/0163385 A1 | * | 7/2011 | Chidambarrao | H01L 29/513 257/369 |
| 2011/0220995 A1 | * | 9/2011 | Chou | H01L 29/66659 257/335 |
| 2012/0205751 A1 | * | 8/2012 | Ohguro | H01L 29/4983 257/411 |
| 2012/0273883 A1 | * | 11/2012 | Chen | H01L 29/0653 257/339 |
| 2013/0181287 A1 | * | 7/2013 | Zhang | H01L 21/28211 257/335 |
| 2015/0221504 A1 | | 8/2015 | Huang et al. | |
| 2016/0079368 A1 | * | 3/2016 | Lin | H01L 29/66575 438/286 |
| 2016/0190269 A1 | * | 6/2016 | Brown | H01L 29/0649 257/343 |
| 2017/0012104 A1 | * | 1/2017 | Delalleau | H01L 21/28167 |
| 2017/0229467 A1 | * | 8/2017 | Ting | H01L 27/10814 |
| 2019/0221660 A1 | * | 7/2019 | Dasgupta | H01L 29/7787 |
| 2019/0386112 A1 | * | 12/2019 | Lu | H01L 29/517 |
| 2020/0194267 A1 | * | 6/2020 | Lee | H01L 21/28176 |
| 2020/0279778 A1 | * | 9/2020 | Ching | H01L 29/0847 |

OTHER PUBLICATIONS

International Preliminary Report on Patentability from PCT/US2017/068558 dated Jul. 9, 2020, 10 pgs.

\* cited by examiner

FIELD EFFECT TRANSISTORS WITH REDUCED ELECTRIC FIELD BY THICKENING DIELECTRIC ON THE DRAIN SIDE

CLAIM OF PRIORITY

This Application is a National Stage Entry of, and claims priority to, PCT Application No. PCT/US2017/068558, filed on Dec. 27, 2017 and titled "REDUCED ELECTRIC FIELD BY THICKENING DIELECTRIC ON THE DRAIN SIDE", which is incorporated by reference in its entirety for all purposes.

BACKGROUND

In semiconductor devices, as transistor dimensions continue to shrink, semiconductor materials that have relatively lower energy band gaps (compared to silicon, for example) are becoming more commonly used. Some examples, include group III-V materials and germanium that may include doping to further lower band gap energy levels. While these lower energy levels can have the benefit of requiring less energy to turn on a transistor, for example, in the off state there could be a greater risk of leakage current as a result of band-to-band tunneling (BTBT). Also, hot carrier injection, where an electron or hole may gain sufficient kinetic energy from an electric field to tunnel through a gate dielectric, can trigger physical damage that can drastically change a device's characteristics over prolonged periods. The accumulation of hot carrier degradation can eventually cause the device to fail as key parameters such as threshold voltage shift due to such damage.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
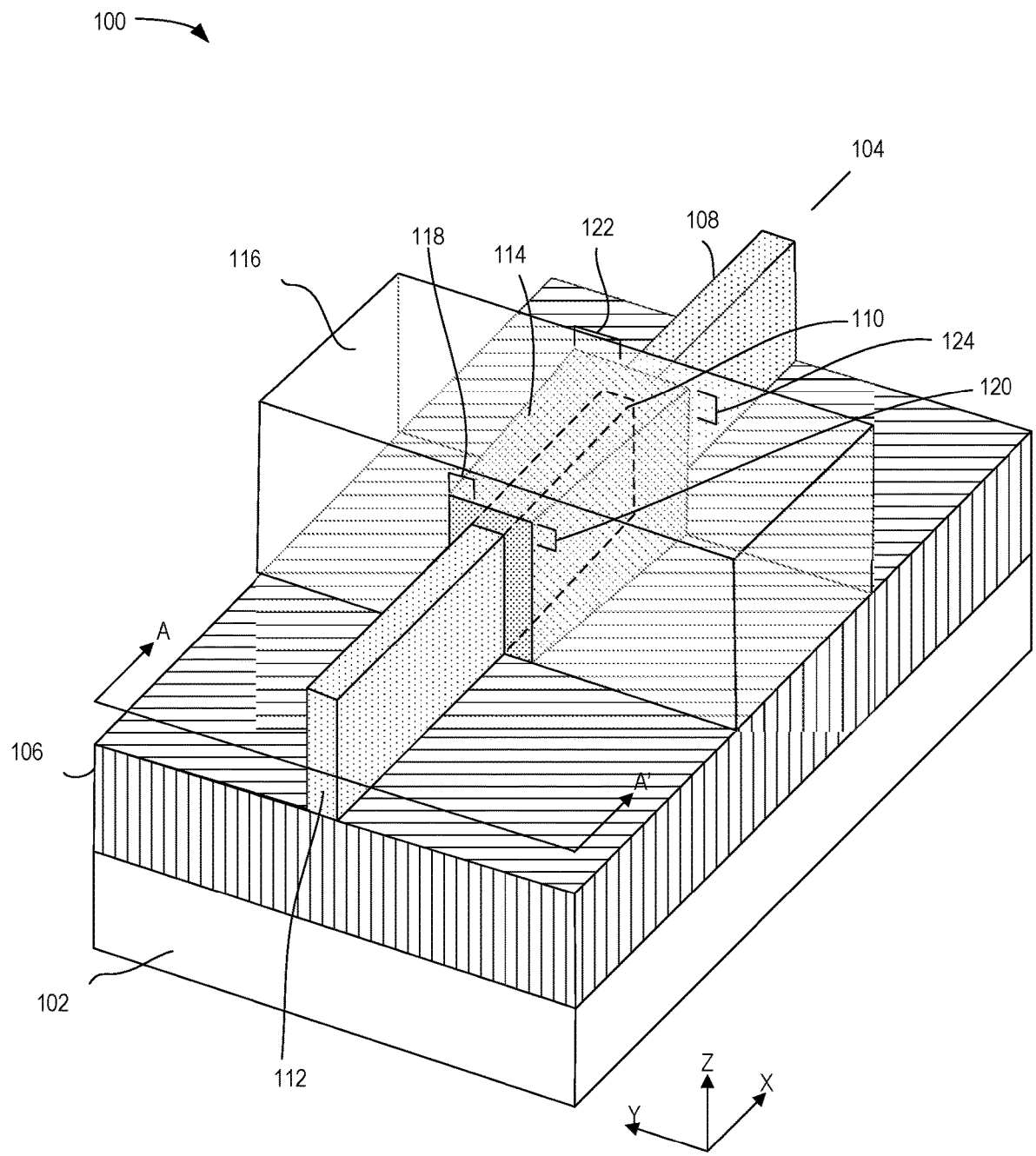
FIG. 1 illustrates a perspective view of an example semiconductor device with a thicker dielectric on the drain side, according to some embodiments.

A thicker dielectric on the drain side of semiconductor devices to reduce an electric field is generally presented. In this regard, embodiments of the present disclosure may enable the reliable use of semiconductor materials with relatively low band gaps. The reduced electric field that results from the thicker dielectric on the drain side may lead to lowered leakage current in the off state and reduced hot carrier injection (and the resulting damage) in the on state. One skilled in the art would appreciate that this approach may enable smaller, lower energy semiconductor devices.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," it, "front," "back," "top," "bottom," "over," "under," and the like in the description and in the claims, if any, are used for descriptive purposes and not necessarily for describing permanent relative positions.

FIG. 1 illustrates a perspective view of an example semiconductor device with a thicker dielectric on the drain side, according to some embodiments. As shown, device 100 includes substrate 102, fin 104, insulator 106, drain region 108, channel region 110, source region 112, gate dielectric 114, gate region 116, source-side dielectric thickness 118, source-side dielectric height 120, drain-side dielectric thickness 122, and drain-side dielectric height 124. While shown as being a FinFET transistor, in other embodiments, device 100 may be a different topology, such as a planar transistor, or different device, such as a diode. While shown as including a single fin 104 and gate region 116, in some embodiments, device 100 may include multiple fins 104 and/or gate regions 116.

In some embodiments, substrate 102 comprises at least one layer of undoped semiconductor, such as Ge, Si, SiGe, InGaAs, AlSb, etc., which may form fin 104. In some embodiments, fin 104, which may include drain region 108, channel region 110, and source region 112, may be formed separately from substrate 102 and may contain different semiconductor materials, including, but not limited to, InGaAs, InAs, InGaAs, InGaAsSb, InSb, GaSb, Ge, or SiGe. Substrate 102 may be composed of one or more semiconductor material layers on top of another semiconductor material such as silicon. In some embodiments, insulator 106 is composed of a buried oxide layer that may insulate fin 104 from substrate 102, while in other embodiments, fin 104 may be formed directly over substrate 102.

When device 100 is in an active mode, channel region 110 may serve as a channel between source region 112 and drain region 108, located on opposite sides of channel region 110. In some embodiments, device 100 may be a PMOS or NMOS transistor and source region 112 and drain region 108 are p-doped or n-doped variants of the same semiconductor as channel region 110.

Gate region 116, along with gate dielectric 114, may form a gate stack on channel region 110. Gate region 116 may be a metal coupled with interconnects, not shown, to provide a voltage proximate to channel region 110 to place device 100 into an active mode. In some embodiments, gate dielectric 114 may include one or more layers of oxides and/or nitrides, that may be formed over one or more sides of channel region 110. In some embodiments, gate dielectric 114 is patterned or shaped, concurrent with or subsequent to formation, such that drain-side dielectric thickness 122 is greater than source-side dielectric thickness 118 and/or drain-side dielectric height 124 is greater than source-side dielectric height 120. As used herein, a drain-side dielectric may be at least about 20% thicker than a source-side dielectric. While gate dielectric 114 is shown has linearly varying between drain-side dielectric thickness 122 and source-side dielectric thickness 118 and between drain-side dielectric height 124 and source-side dielectric height 120, gate dielectric 114 may have thicknesses that vary in other ways, including, but not limited to, the examples shown hereinafter.

FIGS. 2A-2H illustrate cross-sectional views of manufacturing steps of semiconductor devices with a thicker dielectric on the drain side, according to some embodiments. FIGS. 2A-2H may represent alternative embodiments of device 100 depicted along the plane created by lines A and A'. FIGS. 2A-2H are not drawn to scale and a gate region is not illustrated for enhanced clarity.

Figure 2A:
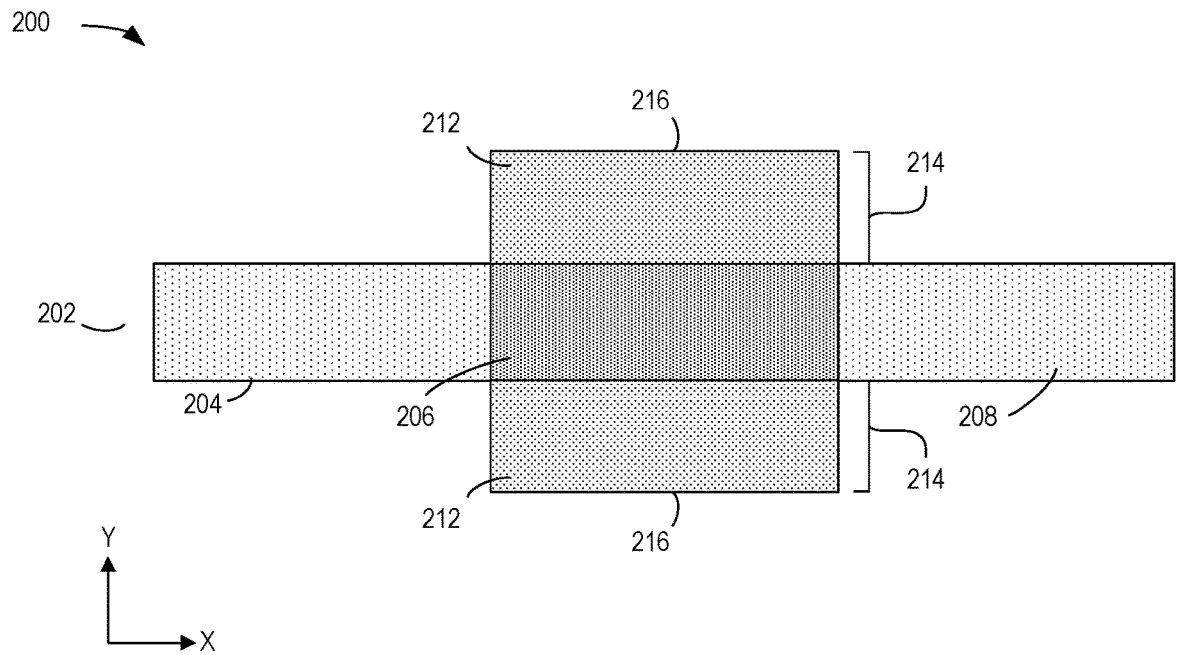
FIGS. 2A-2H illustrate cross-sectional views of manufacturing steps of semiconductor devices with a thicker dielectric on the drain side, according to some embodiments.

As shown in FIG. 2A, assembly 200 includes fin 202, source region 204, channel region 206, drain region 208, dielectric 212, dielectric thickness 214, and dielectric surface 216. In some embodiments, assembly 200 may represent a partially formed transistor. For example, dielectric 212 may be formed over channel region 206 after source region 204 and drain region 208 have been formed in fin 202. Dielectric 212 may represent any dielectric material. In some embodiments, dielectric 212 may include an oxide or a nitride. In some embodiments, dielectric may include a low-k and/or a high-k dielectric, including hafnium-based dielectrics, such as hafnium oxide, for example.

In some embodiments, dielectric 212 may be deposited by known deposition techniques, such as atomic layer deposition (ALD). In other embodiments, dielectric 212 may be formed by oxidizing the underlying semiconductor material of channel region 206. After formation, dielectric 212 may include a uniform dielectric thickness 214, which may be less than about 2 nm, and therefore dielectric surface 216 may be parallel with channel region 206.

Figure 2B:
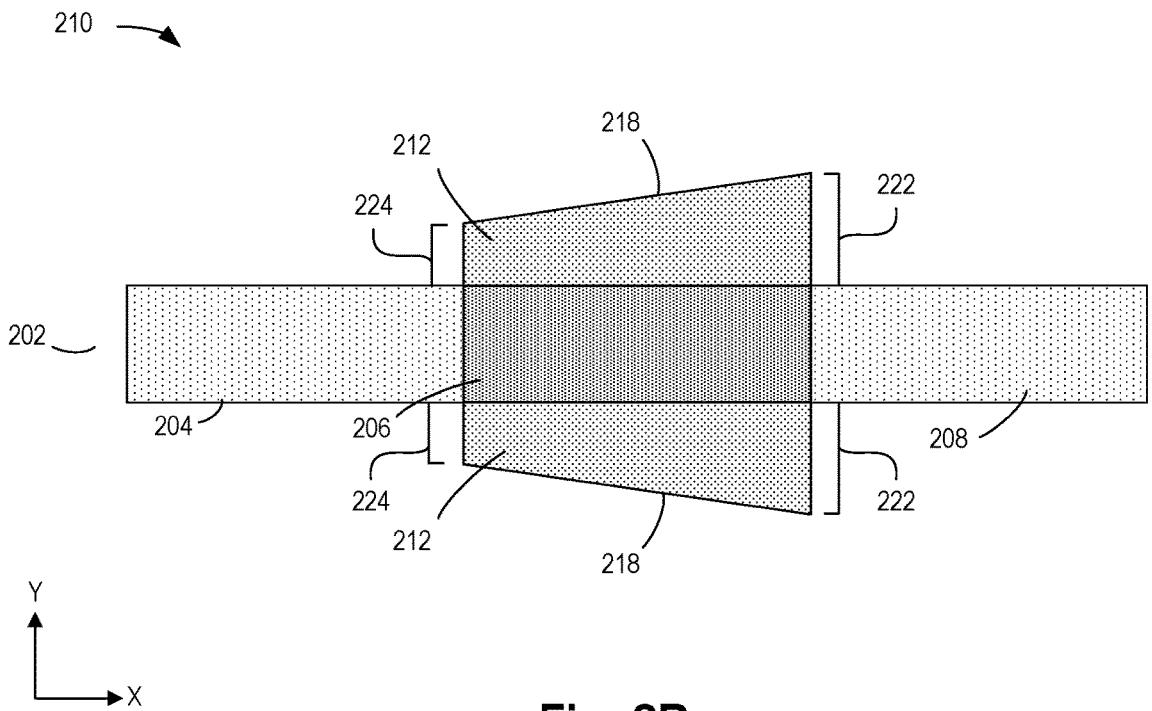

FIG. 2B shows assembly 210, which may include dielectric surface 218, dielectric drain-side thickness 222, and dielectric source-side thickness 224. In some embodiments, dielectric surface 218 may be formed through chemical and/or mechanical processing of dielectric surface 216 including, but not limited to, angled plasma etching, chemical etching, or laser ablation. In other embodiments, dielectric surface 218 may be formed by asymmetrical or angled masking as part of deposition of dielectric 212. Dielectric surface 218 may be smooth or rough, uniform or uneven. In some embodiments, dielectric drain-side thickness 222 is greater than about 20% thicker than dielectric source-side thickness 224. In some embodiments, dielectric drain-side thickness 222 is less than or equal to dielectric thickness 214.

Figure 2C:
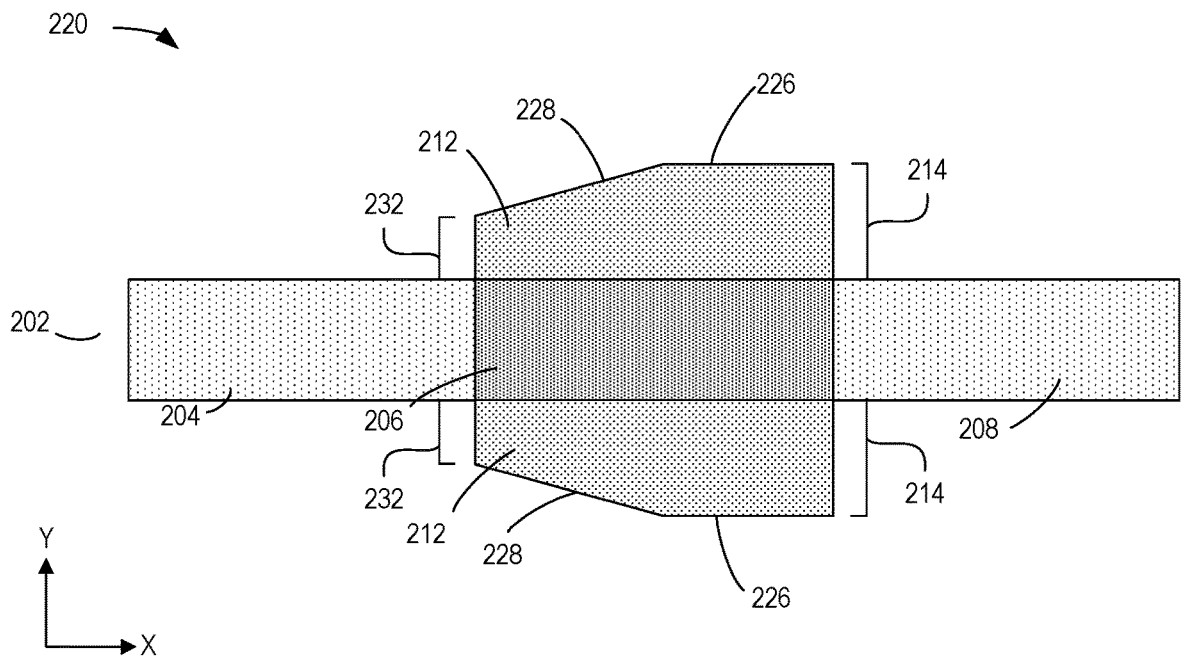

As shown in FIG. 2C, assembly 220 may include dielectric surface 226, dielectric surface 228, and dielectric source-side thickness 232. In some embodiments, dielectric surface 228 may be formed by etching through dielectric surface 216, and thereby linearly reducing dielectric thickness 214 to dielectric source-side thickness 232. In some embodiments, dielectric surface 226 may be less than about half the length of dielectric surface 216.

Figure 2D:
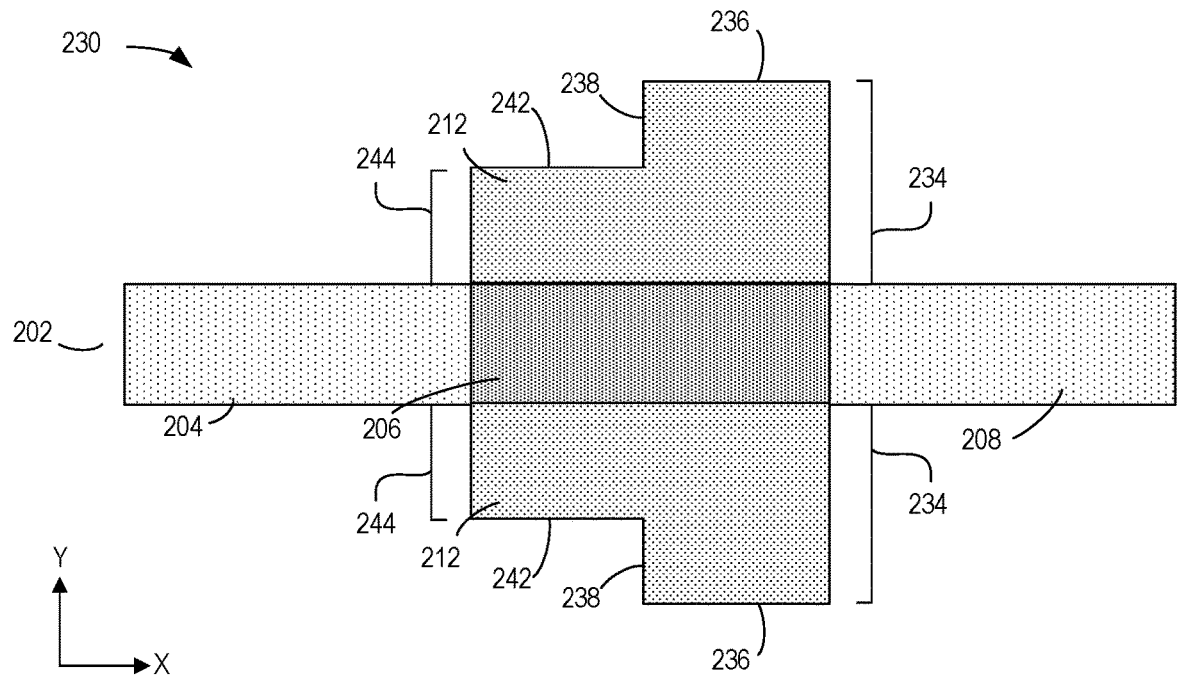

Turning now to FIG. 2D, assembly 230 may include dielectric drain-side thickness 234, dielectric surface 236, step 238, dielectric surface 242, and dielectric source-side thickness 244. In some embodiments, a two-step formation process may initially form a uniform thickness 242 and subsequent masking and additional deposition may increase the thickness above dielectric surface 242 to form step 238, which may be perpendicular to channel region 206, and drain-side thickness 234. In some embodiments, dielectric surface 236 and dielectric surface 242 are about equivalent in length.

Figure 2E:
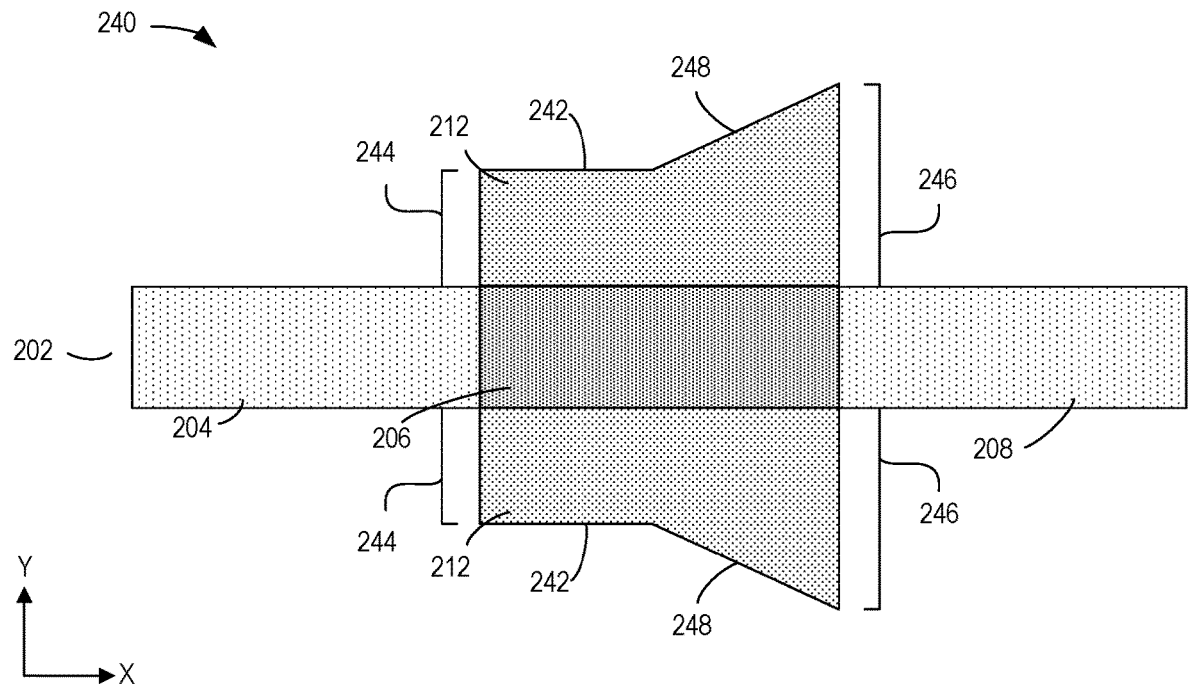

FIG. 2E shows assembly 240, which may include dielectric drain-side thickness 246 and dielectric surface 248. In some embodiments, dielectric surface 248 may be formed by etching through dielectric surface 236, and thereby linearly reducing dielectric drain-side thickness 246 to dielectric source-side thickness 244. In some embodiments, dielectric drain-side thickness 246 is less than or equal to dielectric drain-side thickness 234.

Figure 2F:
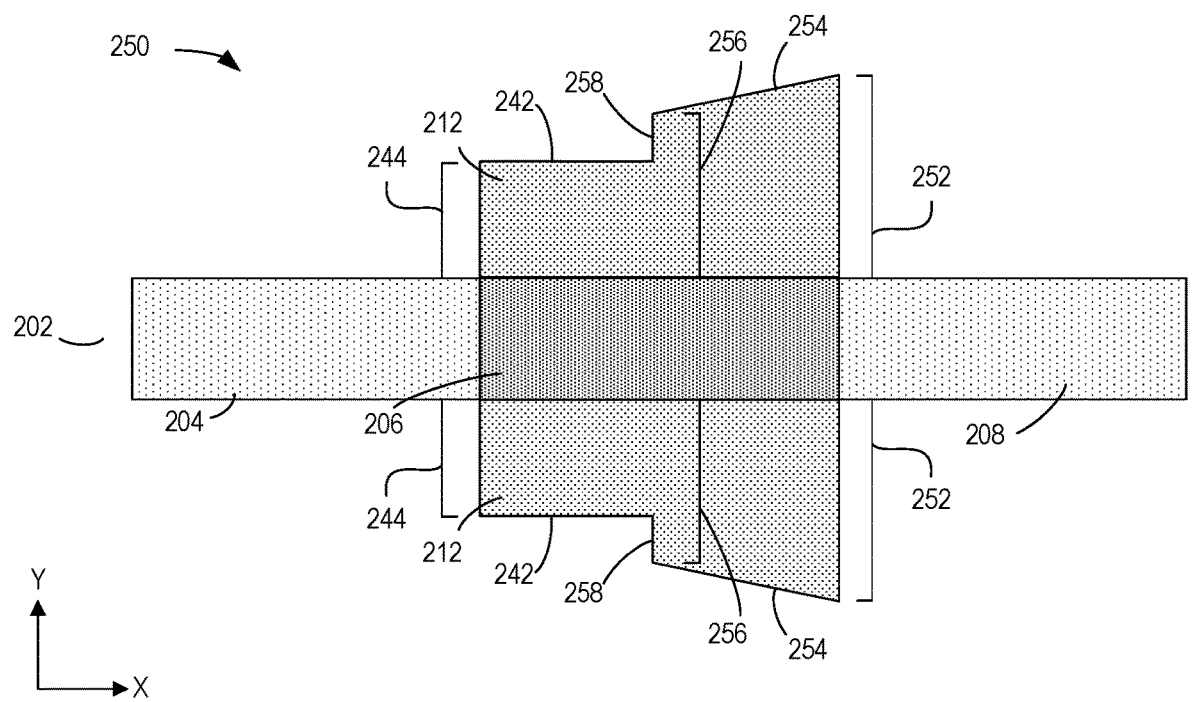

As shown in FIG. 2F, assembly 250 may include dielectric drain-side thickness 252, dielectric surface 254, dielectric thickness 256, and step 258. In some embodiments, dielectric surface 254 may be formed by etching through dielectric surface 236, and thereby linearly reducing dielectric drain-side thickness 252 to dielectric thickness 256. In some embodiments, step 258 may be perpendicular to channel region 206 and may reduce dielectric thickness 256 to dielectric source-side thickness 244. In some embodiments, dielectric drain-side thickness 252 is less than or equal to dielectric drain-side thickness 234.

Figure 2G:
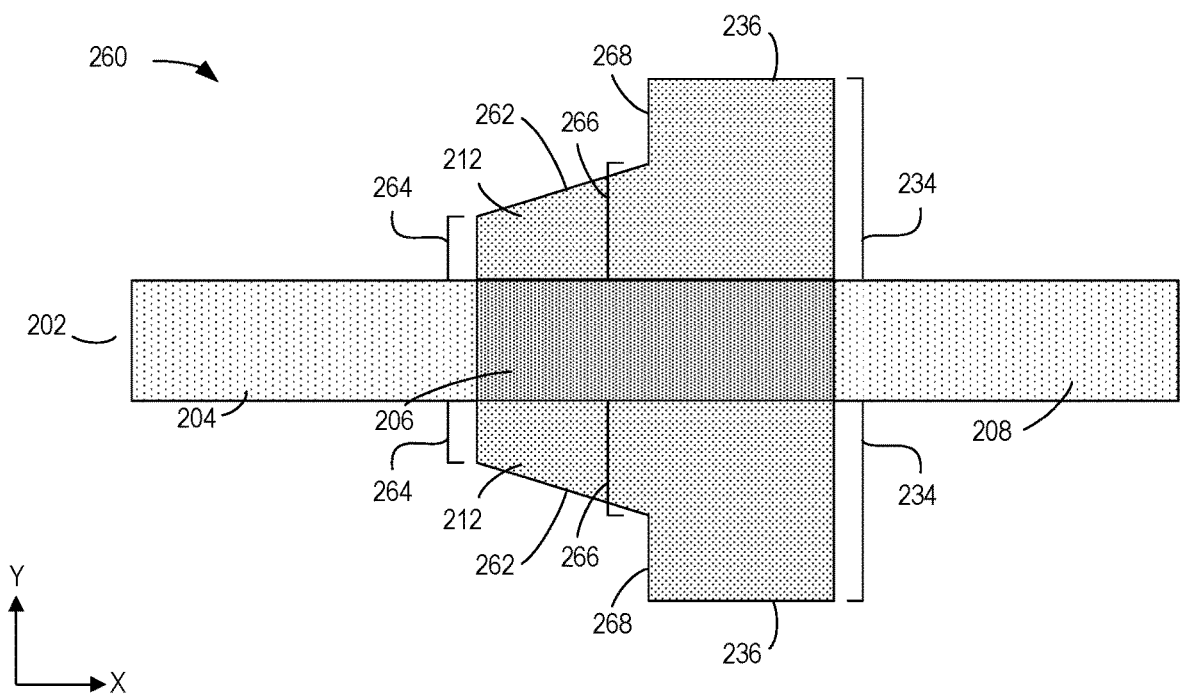

Turning now to FIG. 2G, assembly 260 may include dielectric surface 262, dielectric source-side thickness 264, dielectric thickness 266, and step 268. In some embodiments, dielectric surface 262 may be formed by etching through dielectric surface 242, and thereby linearly reducing dielectric thickness 266 to dielectric source-side thickness 264. In some embodiments, step 268 may be perpendicular to channel region 206 and may reduce dielectric drain-side thickness 234 to dielectric thickness 266. In some embodiments, dielectric thickness 266 is less than or equal to dielectric source-side thickness 244

Figure 2H:
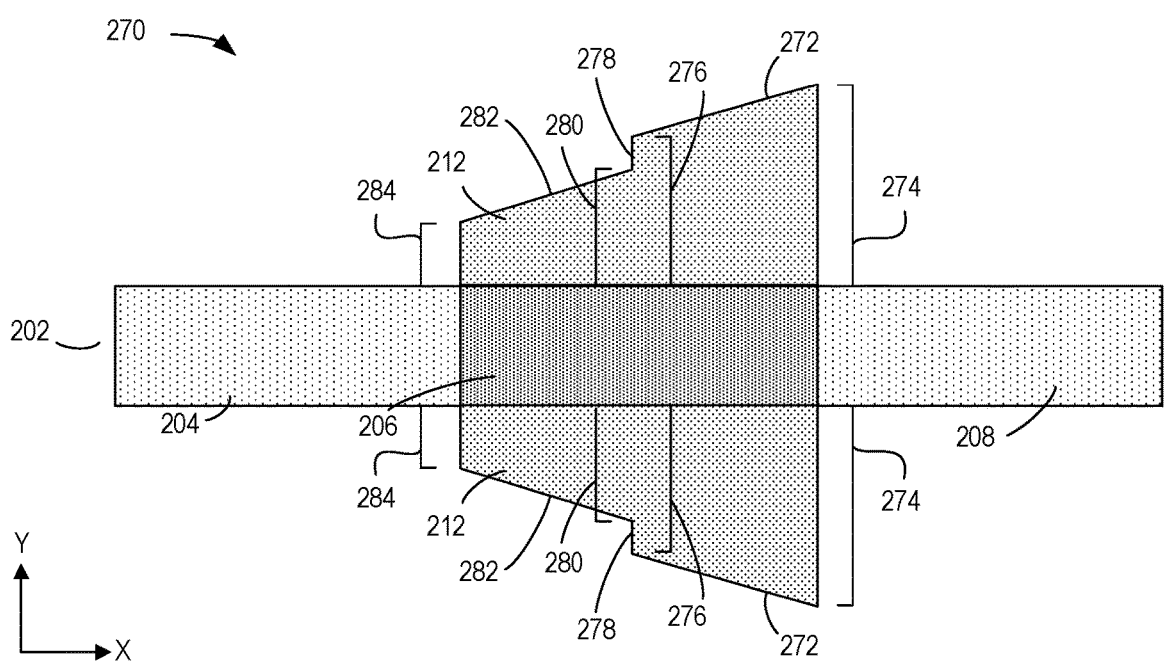

FIG. 2H shows assembly 270, which may include dielectric surface 272, dielectric drain-side thickness 274, dielectric thickness 276, step 278, dielectric thickness 280, dielectric surface 282, and dielectric source-side thickness 284. In some embodiments, dielectric surfaces 272 and 282 may be formed by etching through dielectric surfaces 236 and 242, respectively, and thereby linearly reducing dielectric drain-side thickness 274 to dielectric thickness 276 and dielectric thickness 280 to dielectric source-side thickness 284. In some embodiments, step 278 may be perpendicular to channel region 206 and may reduce dielectric thickness 276 to dielectric thickness 280.

Figure 3A:
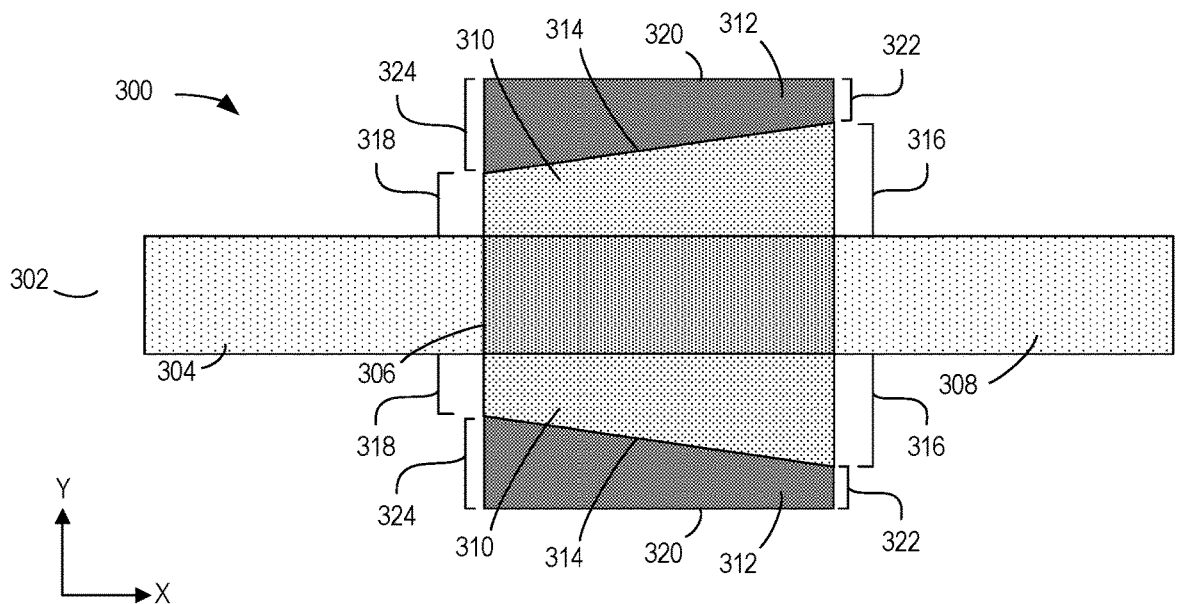
FIGS. 3A & 3B illustrate cross-sectional views of other example semiconductor devices with a thicker dielectric on the drain side, according to some embodiments.
Figure 3B:
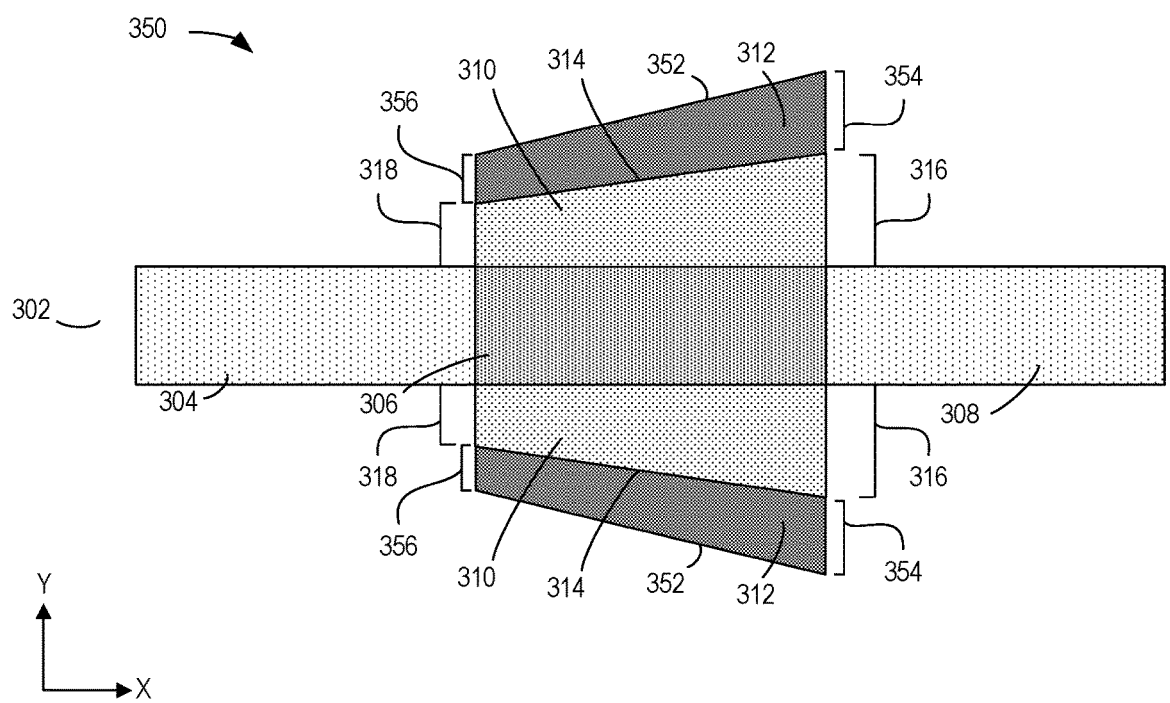

FIGS. 3A & 3B illustrate cross-sectional views of other example semiconductor devices with a thicker dielectric on the drain side, according to some embodiments. FIGS. 3A & 3B may represent alternative embodiments of device 100 having a gate dielectric including multiple dielectric materials. While two examples are shown, it would be appreciated by one skilled in the art that either or both dielectric materials may be patterned or shaped as depicted in FIGS. 2A-2H or in other similar ways.

As shown in FIG. 3A, assembly 300 includes fin 302, source region 304, channel region 306, drain region 308, first dielectric 310, second dielectric 312, first dielectric surface 314, first dielectric drain-side thickness 316, first dielectric source-side thickness 318, second dielectric surface 320, second dielectric drain-side thickness 322, and second dielectric source-side thickness 324. In some embodiments first dielectric 310 and second dielectric 312 may have different dielectric constants, for example one may be a high-k dielectric and the other may be a low-k dielectric. In some embodiments, second dielectric 312 may be deposited over first dielectric 310 with a uniform thickness, and then etched to include a linearly varying thickness. For example, second dielectric 312 may be deposited over first dielectric surface 314 and second dielectric surface 320 may be etched to linearly reduce second dielectric source-side thickness 324 to second dielectric drain-side thickness 322. In some embodiments, second dielectric drain-side thickness 322 plus first dielectric drain-side thickness 316 equals second dielectric source-side thickness 324 plus first dielectric source-side thickness 318, and second dielectric surface 320 is parallel with channel region 306.

FIG. 3B shows assembly 350, which may include fin 302, source region 304, channel region 306, drain region 308, first dielectric 310, second dielectric 312, first dielectric surface 314, first dielectric drain-side thickness 316, first dielectric source-side thickness 318, second dielectric surface 352, second dielectric drain-side thickness 354, and second dielectric source-side thickness 356. In some embodiments, second dielectric drain-side thickness 354 may greater than or equal to second dielectric source-side thickness 356. While shown as being linear, first dielectric surface 314 and/or second dielectric surface 352 may be curved, uneven, or otherwise nonlinear. In some embodiments, second dielectric drain-side thickness 354 plus first dielectric drain-side thickness 316 is at least about 20% greater than second dielectric source-side thickness 356 plus first dielectric source-side thickness 318.

Figure 4:
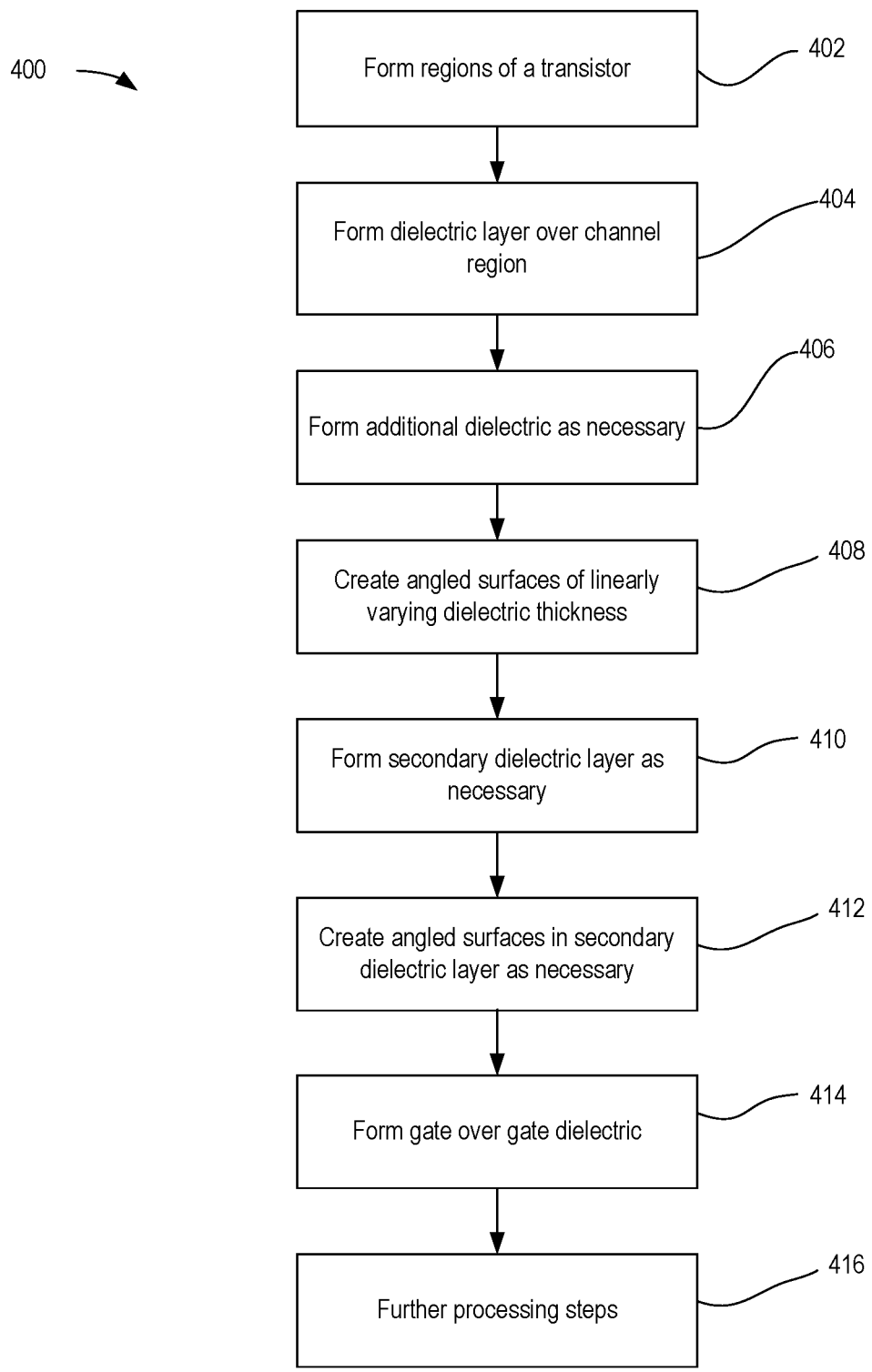
FIG. 4 illustrates a flowchart of a method of forming a semiconductor device with a thicker dielectric on the drain side, in accordance with some embodiments.

FIG. 4 illustrates a flowchart of a method of forming a semiconductor device with a thicker dielectric on the drain side, in accordance with some embodiments. Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 400 begins with forming (402) regions of a transistor. In some embodiments, source/drain regions, for example source 112 and drain 108, are formed by doping regions of a semiconductor fin, for example fin 104. In other embodiments, regions of a transistor may be formed by depositing thin film material. Next, a dielectric layer is formed (404) over a channel region. In some embodiments, dielectric, for example dielectric 212 may be formed by oxidation or deposition over channel region 206. In some embodiments, dielectric 212 may initially be formed with a uniform thickness 214.

Then, additional dielectric may be formed (406) as necessary. In some embodiments, patterned masking may be used over a portion of a dielectric, for example dielectric surface 242, as additional dielectric is deposited to create a step increase in thickness, for example step 238. Next, angled surfaces may be created (408) that linearly vary the thickness of the dielectric. In some embodiments, an angled plasma etch may be used to create dielectric surfaces that linearly reduce the dielectric thickness from the drain-side to the source-side, for example as shown in any of FIG. 2B, 2C, or 2E-2H.

The method continues with forming (410) a secondary dielectric layer as necessary. In some embodiments, a second dielectric material having a higher dielectric constant greater than a dielectric constant of a previously formed dielectric material, which may or may not have been etched to include angled surfaces, is formed over the previously formed dielectric material. Next, angled surfaces may be created (412) in the secondary dielectric as necessary. In some embodiments, the secondary dielectric may be etched, for example by an angled plasma etch, to create linearly varying thicknesses either similar or contrasting to the first dielectric. In some embodiments, a second and first dielectric are complementary such that an outer dielectric surface is parallel to a channel region surface.

Then a gate may be formed (414) over the gate dielectric. In some embodiments, a gate, such as gate 116, may include one or more metal layers. Finally, further processing steps (416) may be performed to form the semiconductor device. In some embodiments, source and drain contacts and further interconnect layers are formed.

Figure 5:
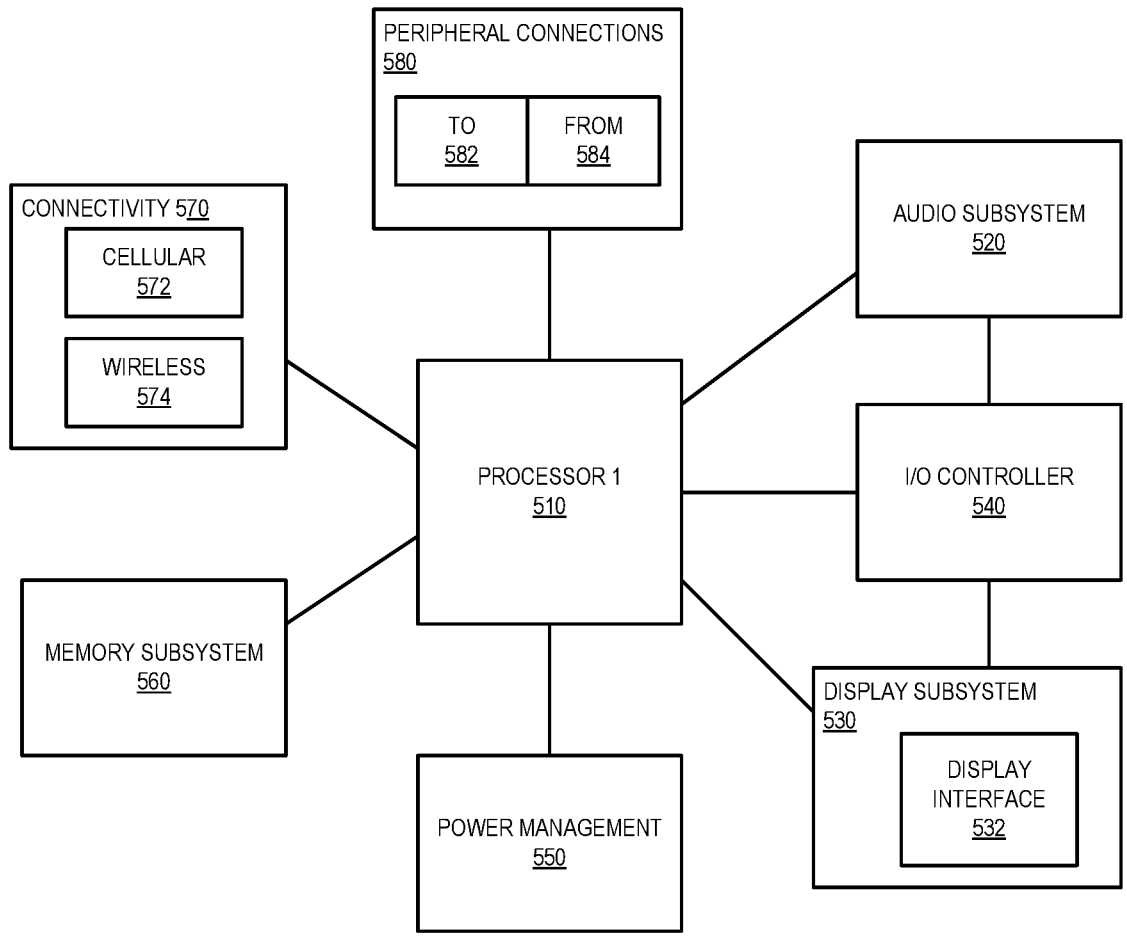
FIG. 5 illustrates a smart device or a computer system or a SoC (System-on-Chip) which includes a semiconductor device with a thicker dielectric on the drain side, according to some embodiments.

FIG. 5 illustrates a smart device or a computer system or a SoC (System-on-Chip) 500 which includes a semiconductor device with a thicker dielectric on the drain side, according to some embodiments. In some embodiments, computing device 500 represents a mobile computing device, such as a computing tablet, a mobile phone or smart-phone, a wireless-enabled e-reader, or other wireless mobile device. It will be understood that certain components are shown generally, and not all components of such a device are shown in computing device 500. In some embodiments, one or more components of computing device 500, for example processor 510 and/or memory subsystem 560, include a semiconductor device with a thicker dielectric on the drain side as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 500 includes a first processor 510. The various embodiments of the present disclosure may also comprise a network interface within 570 such as a wireless interface so that a system embodiment may be incorporated into a wireless device, for example, cell phone or personal digital assistant.

In one embodiment, processor 510 can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting the computing device 500 to another device. The processing operations may also include operations related to audio I/O and/or display I/O.

In one embodiment, computing device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 500, or connected to the computing device 500. In one embodiment, a user interacts with the computing device 500 by providing audio commands that are received and processed by processor 510.

Display subsystem 530 represents hardware (e.g., display devices) and software (e.g., drivers) components that provide a visual and/or tactile display for a user to interact with the computing device 500. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touch screen (or touch pad) device that provides both output and input to a user.

I/O controller 540 represents hardware devices and software components related to interaction with a user. I/O controller 540 is operable to manage hardware that is part of audio subsystem 520 and/or display subsystem 530. Additionally, I/O controller 540 illustrates a connection point for additional devices that connect to computing device 500 through which a user might interact with the system. For example, devices that can be attached to the computing device 500 might include microphone devices, speaker or stereo systems, video systems or other display devices, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of the computing device 500. Additionally, audio output can be provided instead of, or in addition to display output. In another example, if display subsystem 530 includes a touch screen, the display device also acts as an input device, which can be at least partially managed by I/O controller 540. There can also be additional buttons or switches on the computing device 500 to provide I/O functions managed by I/O controller 540.

In one embodiment, I/O controller 540 manages devices such as accelerometers, cameras, light sensors or other environmental sensors, or other hardware that can be included in the computing device 500. The input can be part of direct user interaction, as well as providing environmental input to the system to influence its operations (such as filtering for noise, adjusting displays for brightness detection, applying a flash for a camera, or other features).

In one embodiment, computing device 500 includes power management 550 that manages battery power usage, charging of the battery, and features related to power saving operation. Memory subsystem 560 includes memory devices for storing information in computing device 500. Memory can include nonvolatile (state does not change if power to the memory device is interrupted) and/or volatile (state is indeterminate if power to the memory device is interrupted) memory devices. Memory subsystem 560 can store application data, user data, music, photos, documents, or other data, as well as system data (whether long-term or temporary) related to the execution of the applications and functions of the computing device 500.

Elements of embodiments are also provided as a machine-readable medium (e.g., memory 560) for storing the computer-executable instructions. The machine-readable medium (e.g., memory 560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 570 includes hardware devices (e.g., wireless and/or wired connectors and communication hardware) and software components (e.g., drivers, protocol stacks) to enable the computing device 500 to communicate with external devices. The computing device 500 could be separate devices, such as other computing devices, wireless access points or base stations, as well as peripherals such as headsets, printers, or other devices.

Connectivity 570 can include multiple different types of connectivity. To generalize, the computing device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 580 include hardware interfaces and connectors, as well as software components (e.g., drivers, protocol stacks) to make peripheral connections. It will be understood that the computing device 500 could both be a peripheral device ("to" 582) to other computing devices, as well as have peripheral devices ("from" 584) connected to it. The computing device 500 commonly has a "docking" connector to connect to other computing devices for purposes such as managing (e.g., downloading and/or uploading, changing, synchronizing) content on computing device 500. Additionally, a docking connector can allow computing device 500 to connect to certain peripherals that allow the computing device 500 to control content output, for example, to audiovisual or other systems.

In addition to a proprietary docking connector or other proprietary connection hardware, the computing device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an integrated circuit device structure is provided comprising: a source and a drain with a channel region therebetween, the channel region comprising a semiconductor material; and a gate dielectric layer over at least a portion of the channel region, wherein the gate dielectric layer comprises a first thickness proximate to the source and a second thickness proximate to the drain, wherein the second thickness is greater than the first thickness, and wherein at least a portion of the gate dielectric layer comprises a linearly varying thickness over the channel region.

In some embodiments, the gate dielectric layer comprises substantially linearly varied thicknesses between the first thickness and the second thickness. In some embodiments, the gate dielectric layer comprises a length of constant thickness, wherein the length of constant thickness comprises the first thickness or the second thickness. In some embodiments, the gate dielectric layer comprises substantially linearly varied thicknesses between the second thickness and a third thickness, wherein the third thickness is less than the second thickness, the gate dielectric layer further comprising a step change in thickness between the third thickness and the first thickness. In some embodiments, the gate dielectric layer comprises substantially linearly varied thicknesses between the first thickness and a third thickness, wherein the third thickness is greater than the first thickness, the gate dielectric layer further comprising a step change in thickness between the third thickness and the second thickness. In some embodiments, the gate dielectric layer comprises a first gate dielectric layer, and further comprising a second gate dielectric layer on the first gate dielectric layer. In some embodiments, the second gate dielectric layer comprises a third thickness proximate to the source and a fourth thickness proximate to the drain, wherein the fourth thickness is greater than the third thickness, and wherein at least a portion of the second gate dielectric layer comprises a linearly varying thickness over the channel region. In some embodiments, the second gate dielectric layer comprises a third thickness proximate to the source and a fourth thickness proximate to the drain, wherein the third thickness is greater than the fourth thickness, and wherein a top surface of the second gate dielectric layer is substantially parallel with a top surface of the channel region. In some embodiments, the second gate dielectric layer comprises a dielectric constant greater than a dielectric constant of the first gate dielectric layer. In some embodiments, the gate dielectric layer is over portions of two or more sides of the channel region. In some embodiments, the channel region comprises germanium.

In another example, a system is provided comprising: a display subsystem; a wireless communication interface; and an integrated circuit device, the integrated circuit device comprising: a source and a drain with a channel region therebetween, the channel region comprising a semiconductor material; and a gate dielectric layer over at least a portion of the channel region, wherein the gate dielectric layer comprises a first thickness proximate to the source and a second thickness proximate to the drain, wherein the second thickness is greater than the first thickness, and wherein at least a portion of the gate dielectric layer comprises linearly varied thicknesses between the first thickness and the second thickness.

In some embodiments, the gate dielectric layer comprises substantially linearly varied thicknesses between the second thickness and a third thickness, wherein the third thickness is less than the second thickness, the gate dielectric layer further comprising a step change in thickness between the third thickness and the first thickness. In some embodiments, the gate dielectric layer comprises substantially linearly varied thicknesses between the first thickness and a third thickness, wherein the third thickness is greater than the first thickness, the gate dielectric layer further comprising a step change in thickness between the third thickness and the second thickness. In some embodiments, the gate dielectric layer comprises a first gate dielectric layer, and further comprising a second gate dielectric layer on the first gate dielectric layer, and wherein the second gate dielectric layer comprises a dielectric constant greater than a dielectric constant of the first gate dielectric layer. In some embodiments, the second gate dielectric layer comprises a third thickness proximate to the source and a fourth thickness proximate to the drain, wherein the fourth thickness is greater than the third thickness, and wherein at least a portion of the second gate dielectric layer comprises a linearly varying thickness over the channel region. In some embodiments, the second gate dielectric layer comprises a third thickness proximate to the source and a fourth thickness proximate to the drain, wherein the third thickness is greater than the fourth thickness, and wherein a top surface of the second gate dielectric layer is substantially parallel with a top surface of the channel region. Some embodiments also include the gate dielectric layer over portions of two or more sides of the channel region. In some embodiments, the gate dielectric comprises hafnium and oxygen.

In another example, a method of forming an integrated circuit device structure is provided comprising: forming a source and a drain with a channel region therebetween, the channel region comprising a semiconductor material; and forming a gate dielectric layer over at least a portion of the channel region, wherein the gate dielectric layer comprises a first thickness proximate to the source and a second thickness proximate to the drain, wherein the second thickness is greater than the first thickness, and wherein at least a portion of the gate dielectric layer comprises linearly varied thicknesses between the first thickness and the second thickness.

In some embodiments, forming the gate dielectric comprises: oxidizing the channel region to form an oxide layer of the second thickness; and plasma etching the oxide layer at an angle to form the first thickness. In some embodiments, forming the gate dielectric comprises: depositing a dielectric material of the second thickness on the channel region; and plasma etching the dielectric material at an angle to form the first thickness. In some embodiments, forming the gate dielectric comprises: depositing a first layer of dielectric material up to the first thickness on the channel region; masking a first length of the first layer of dielectric material; depositing a second layer of dielectric material up to the second thickness on a second length of the first layer of dielectric material; and plasma etching the dielectric material at an angle to form a third thickness. Some embodiments also include forming the gate dielectric over portions of two or more sides of the channel region. In some embodiments, forming the gate dielectric comprises forming a first gate dielectric layer on the channel region and forming a second gate dielectric layer on the first gate dielectric layer, wherein the second gate dielectric layer comprises a dielectric constant greater than a first gate dielectric layer dielectric constant. In some embodiments, forming the second gate dielectric layer comprises forming an outer surface of the second gate dielectric layer parallel with the channel region.

In another example, an integrated circuit device package is provided comprising: a package substrate; and an integrated circuit device, the integrated circuit device comprising: a source and a drain with a channel region therebetween, the channel region comprising a semiconductor material; and a gate dielectric layer over at least a portion of the channel region, wherein the gate dielectric layer comprises a first thickness proximate to the source and a second thickness proximate to the drain, wherein the second thickness is greater than the first thickness, and wherein at least a portion of the gate dielectric layer comprises linearly varied thicknesses between the first thickness and the second thickness.

In some embodiments, the gate dielectric layer comprises substantially linearly varied thicknesses between the second thickness and a third thickness, wherein the third thickness is less than the second thickness, the gate dielectric layer further comprising a step change in thickness between the third thickness and the first thickness. In some embodiments, the gate dielectric layer comprises substantially linearly varied thicknesses between the first thickness and a third thickness, wherein the third thickness is greater than the first thickness, the gate dielectric layer further comprising a step change in thickness between the third thickness and the second thickness. In some embodiments, the gate dielectric layer comprises a first gate dielectric layer, and further comprising a second gate dielectric layer on the first gate dielectric layer, and wherein the second gate dielectric layer comprises a dielectric constant greater than a dielectric constant of the first gate dielectric layer. In some embodiments, the second gate dielectric layer comprises a third thickness proximate to the source and a fourth thickness proximate to the drain, wherein the fourth thickness is greater than the third thickness, and wherein at least a portion of the second gate dielectric layer comprises a linearly varying thickness over the channel region. In some embodiments, the second gate dielectric layer comprises a third thickness proximate to the source and a fourth thickness proximate to the drain, wherein the third thickness is greater than the fourth thickness, and wherein a top surface of the second gate dielectric layer is substantially parallel with a top surface of the channel region. Some embodiments also include the gate dielectric layer over portions of two or more sides of the channel region. In some embodiments, the gate dielectric comprises hafnium and oxygen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit device structure comprising:
   a source and a drain with a channel region therebetween, the channel region comprising a semiconductor material; and a gate dielectric over at least a portion of the channel region, wherein the gate dielectric has a first gate dielectric, and a second gate dielectric layer on the first gate dielectric layer, wherein the first gate dielectric has a first thickness proximate to the source and a second thickness proximate to the drain, wherein the second thickness is greater than the first thickness, and wherein at least a portion of the first gate dielectric has a linearly varied thickness over the channel region.

2. The integrated circuit device structure of claim 1, wherein the second gate dielectric layer has a third thickness proximate to the source and a fourth thickness proximate to the drain, wherein the fourth thickness is greater than the third thickness, and wherein at least a portion of the second gate dielectric layer over the channel region has a linearly varied thickness.

3. The integrated circuit device structure of claim 2, wherein a top surface of the second gate dielectric layer is substantially parallel with a top surface of the channel region.

4. The integrated circuit device structure of claim 1, wherein the first gate dielectric layer comprises a first material with a first dielectric constant, the second gate dielectric layer comprises a second material with a second dielectric constant, and wherein the first dielectric constant is less than the second dielectric constant.

5. The integrated circuit device structure of claim 1, wherein the gate dielectric is over a side of the channel region.

6. The integrated circuit device structure of claim 1, wherein the channel region comprises germanium.

7. A method of forming an integrated circuit device structure comprising:
forming a source and a drain with a channel region therebetween, the channel region comprising a semiconductor material; and
forming a gate dielectric over at least a portion of the channel region, wherein the gate dielectric has a first thickness proximate to the source and a second thickness proximate to the drain, wherein the second thickness is greater than the first thickness, and wherein at least a portion of the gate dielectric has a linearly varied thicknesses between the first thickness and the second thickness, wherein forming the gate dielectric comprises at least one of:
oxidizing the channel region to form an oxide layer of the second thickness; and
plasma etching the oxide layer at an angle to form the first thickness; or
depositing a dielectric material of the second thickness on the channel region; and
plasma etching the dielectric material at an angle to form the first thickness.

8. The method of claim 7, wherein forming the gate dielectric comprises:
depositing a first layer of dielectric material up to the first thickness on the channel region;
depositing a second layer of dielectric material up to the second thickness on a second length of the first layer of dielectric material; and
plasma etching the dielectric material at an angle to form a third thickness.

9. The method of claim 7, further comprising forming the gate dielectric over a side of the channel region.

10. The method of claim 7, wherein forming the gate dielectric comprises forming a first gate dielectric layer on the channel region and forming a second gate dielectric layer on the first gate dielectric layer, wherein the first gate dielectric layer comprises a first material having a first dielectric constant less than a second dielectric constant of a second material of the second gate dielectric layer.

* * * * *